United States Patent [19]

Yoshizawa et al.

[11] Patent Number: 5,065,361
[45] Date of Patent: Nov. 12, 1991

[54] SEMICONDUCTOR MEMORY INTEGRATED CIRCUIT

[75] Inventors: Makoto Yoshizawa, Tokyo; Tadashi Maruyama, Yokohama, both of Japan

[73] Assignee: Kabushiki Kaisha Toshiba, Kawasaki, Japan

[21] Appl. No.: 446,003

[22] Filed: Dec. 5, 1989

[30] Foreign Application Priority Data

Dec. 24, 1988 [JP] Japan .................. 63-326453

[51] Int. Cl.⁵ ........................................... G11C 17/08
[52] U.S. Cl. ...................... 365/104; 365/185;
365/230.06; 365/230.08; 307/296.1; 307/451;
307/475; 307/452
[58] Field of Search ............ 365/230.26, 230.08,
365/185, 104; 307/452, 451, 475, 296.1

[56] References Cited

U.S. PATENT DOCUMENTS 4,697,101  9/1987  Iwahashi et al. ............... 307/452
4,788,457  11/1988  Mashiko et al. ............... 307/449
4,916,334  4/1990  Minagawa et al. ............. 365/104

FOREIGN PATENT DOCUMENTS 0171718  2/1986  European Pat. Off. .

Primary Examiner—Joseph E. Clawson, Jr.
Attorney, Agent, or Firm—Finnegan, Henderson, Farabow, Garrett, and Dunner

[57] ABSTRACT

A semiconductor memory integrated circuit is made up of a decoder, a memory matrix, and a decode output buffer selectively receiving a first or second power source voltage. The decode output buffer is provided between the decoder and the memory matrix, and includes an inverter circuit for inverting the output signal of the decoder, and a MOS transistor of a depletion mode, the gate of which is connected to the output terminal of the inverter, the first end of which is connected to a supply node of the first or second power source voltage, and the second end of which is connected to a power voltage supply node of the inverter circuit.

3 Claims, 5 Drawing Sheets

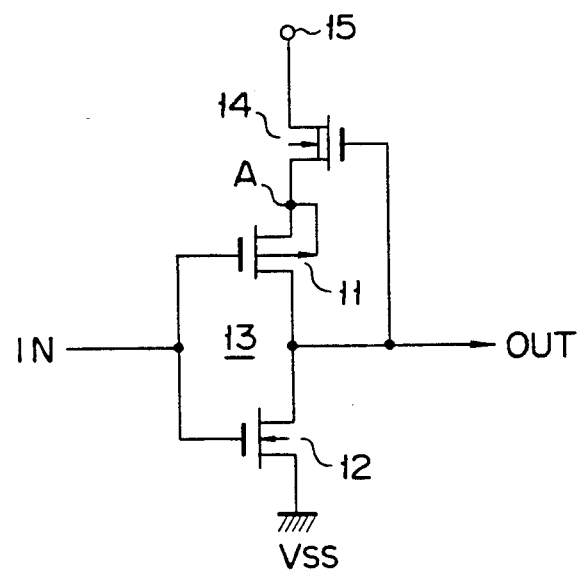
F I G. 3

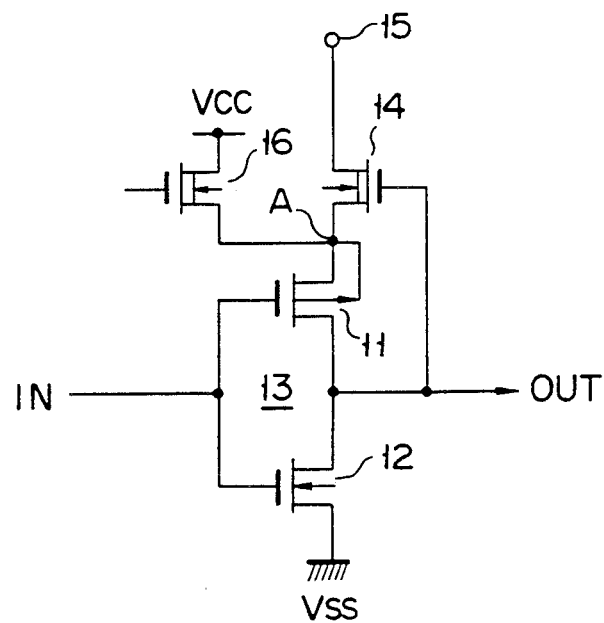
F I G. 4
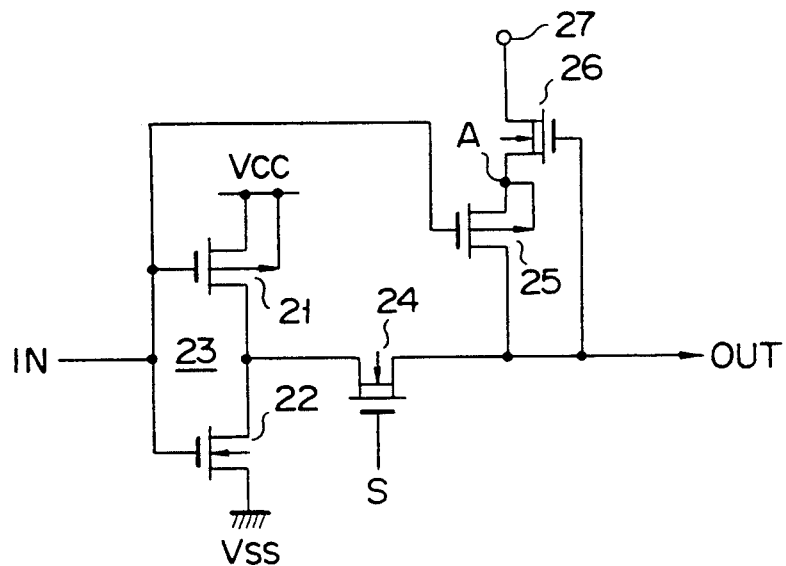
F I G. 5

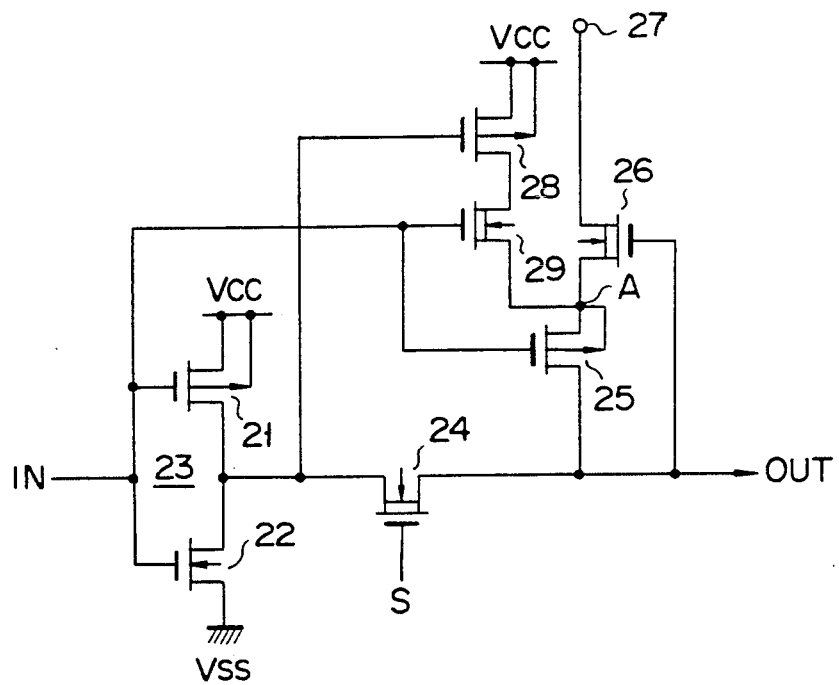
F I G. 6
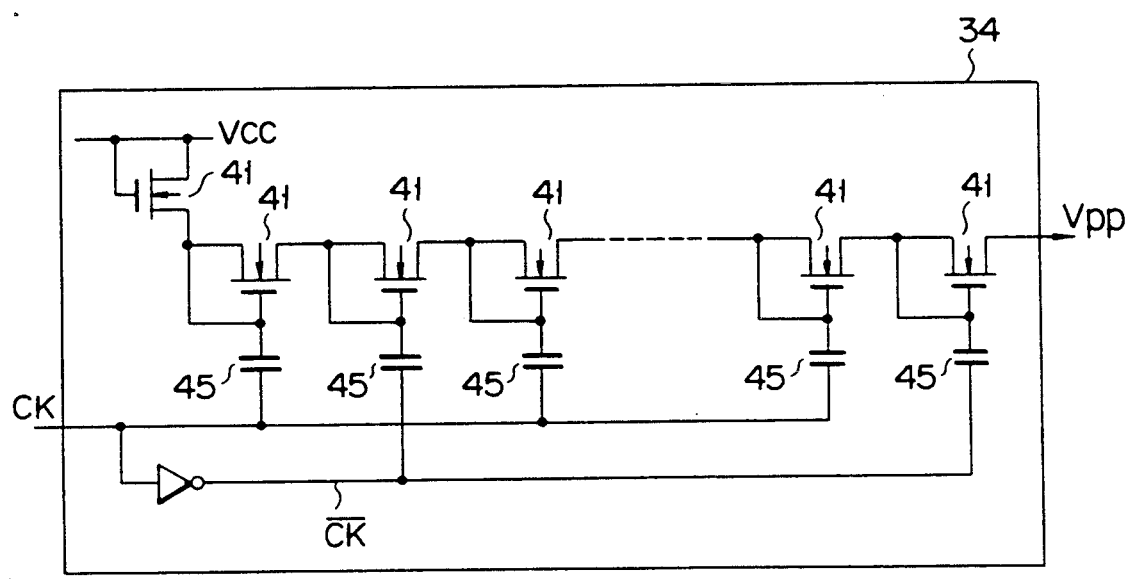
F I G. 8

SEMICONDUCTOR MEMORY INTEGRATED CIRCUIT

BACKGROUND OF THE INVENTION

1. Field of the Invention

The present invention relates to a semiconductor memory device which is selectively supplied with different power source voltages.

2. Description of the Related Art

As known, in a nonvolatile memory device used in a write mode to write data into memory cells, a high voltage is applied to a decode line coupled with the gate or drain of the memory cell to which data is to be loaded.

FIG. 1 shows a circuit diagram of a major part of a conventional EEPROM (electrically erasable and programmable ROM) known as a nonvolatile memory device. The operation of the EEPROM wherein a high voltage is applied to the decode line, will be described. In response to a chip enable signal CE supplied to a control circuit or controller 51, the memory system is driven to be in a operation mode. During the operation mode, data is written into the memory cell by a write signal WR supplied to the controller 51. Specifically, an address signal AD is decoded by a decoder 52, so that one of the decode lines 53 is selected and energized to be set in logic "1" level. The potential of the logic "1" level is applied, through a selected cell row 55 (selected cell row) connected to the selected decode line 53 in a memory matrix 54, to a charge pump circuit 56 connected to the selected cell row. As a result, a high voltage generated by a high voltage generator 57 is supplied to the decode line 53, through the charge pump 56.

The charge pump 56 and the high voltage generator 57 are respectively driven by clock signals CK1 and CK2.

FIG. 2 shows a detailed circuit diagram of the charge pump circuit 56 in the memory system of FIG. 1. In the charge pump 56, the gate of an n-channel MOS transistor 61 is connected to the decode line 53. A high voltage Vpp generated by the high voltage generator 57 is applied to the drain of the transistor 61. The source-drain path of a n-channel MOS transistor 62 is inserted between the gate and the source of the transistor 61. The gate of the transistor 62 is connected to its drain. Accordingly, the clock signal CK1 is supplied through a capacitor 63 to the charge pump. During the operation mode that the chip enable signal CE is being generated, the clock signal CK1 is constantly supplied at predetermined periods.

In the charge pump 56 thus arranged, the decoder 52 applies a voltage of 5 V, for example, to a selected decoder line 53. The voltage is applied through the selected cell row 55 to the gate of the transistor 61 of the charge pump 56 connected to the cell row. In response to the voltage, the transistor 61 is turned on, so that with the high voltage Vpp applied to its drain, a voltage (5V) nearly equal to the gate voltage of the transistor 61 is applied to the gate and the drain of the transistor 62 and a first end of the capacitor 63. The voltage is boosted through the pumping operation by the clock signal CK1 applied to the second end of the capacitor 63 and swinging between 0V and 5V. The boosted voltage is applied to the gate and the drain of the transistor 62, and the first end of the capacitor 63. The boosted voltage is also supplied to the gate of the transistor 61 through the transistor 62. The above sequence of operations is repeated, and finally a voltage, which is the sum of the output voltage Vpp of the high voltage generator 57 and the boosted voltage "α" by the pumping of the clock CK1, is applied to the gate of the transistor 61, i.e., the selected decode line 53. In this way, the voltage of a satisfactorily large amplitude is applied to the cell row 54 coupled with the selected decode line 53.

The non-selected decode line 53 receives 0V from the decoder 52, so that the transistor 61 of the charge pump 56 coupled with the non-selected decode line 53 is turned off.

The clock signal CK1 is applied to all of the charge pumps 56 irrespective of their connections to the selected line or non-selected decode line. Accordingly, in the charge pumps coupled with the non-selected decode lines, the pumping operation is performed through the capacitor 63 when the level of the clock signal changes, so that a minute voltage is applied to the gate and the drain of the transistor 62. Further, the minute voltage is applied to the gate of the transistor 61 through the transistor 62. Finally, the transistor 61 is turned on and the high voltage Vpp generated by the high voltage generator 57 is applied to the drain of the transistor 62 and the capacitor 63. Thus, even for the nonselected decode line, a current path is inevitably formed, which is through the high voltage generator 57, the transistors 61 and 62 of the charge pump 56, and the non-selected decode line 53. As a result, the high voltage generated by the high voltage generator 57 drops, and there is the possibility that the high voltage Vpp, that is supplied to the selected decoder line, is unsatisfactorily high. The high voltage generator 57 is formed on the integrated circuit, and its current capacity is small. Therefore, when the current path is formed, it cannot generate a high voltage.

The charge pump 56 shown in FIG. 2 is constructed with n-channel MOS transistors. Generally, the n-channel MOS transistor is turned on when the voltage Vgs between the gate and the source exceeds the threshold voltage Vth. In the charge pump circuit 56, the drain voltage of the transistor 61 is Vpp and hence high. The effective threshold voltage V of the transistor 61 is (Vth+β), which is higher than the theoretical value due to the back-gate effect. Therefore, the voltage to turn on the n-channel MOS transistor is increased by the back-gate voltage β, and is given by the following relation $$Vgs > Vth + \beta$$

where

Vth: threshold voltage of the transistor 61,

β: back-gate voltage due to the back-gate effect.

Thus, as the voltage Vpp is higher, it is more difficult to turn on the transistor 61. To avoid this, the charge pump should be operated at a low voltage. In this case, the pumping operation necessarily progresses at a low voltage. Accordingly, the voltage required when the clock signal CK1 charges the capacitor 63 is low, resulting in a smaller increase of the gate - source voltage Vgs of the transistor 62. The result is that the transistor fails to turn on and the selected decode line 53 is saturated at a certain voltage, and a satisfactorily high voltage cannot be applied to the selected decode line 53.

As described above, the conventional semiconductor memory device using the charge pump circuit suffers from a great current loss, because the pumping operation of the charge pump causes the current from high voltage generator to flow to the non-selected decode line. Further, when the memory system is operated at a low voltage, the pumping operation of the charge pump is not perfect. Accordingly, the high voltage, which is generated by the high voltage generator and is supplied to the selected decode line, is insufficiently high. As a consequence, the dynamic characteristic of the memory system is degraded.

SUMMARY OF THE INVENTION

Accordingly, an object of the present invention is to provide a semiconductor memory device which is free from the deleterious current flowing from the high voltage generator to the non-selected decode line, and is operable at a low voltage.

According to the present invention, there is provided a semiconductor memory integrated circuit comprising: a decoder; a memory matrix; and a decode output buffer selectively receiving a first or second power source voltage. The decode output buffer is provided between the decoder and the memory matrix, and comprises an inverter circuit for inverting the output signal of the decoder, and a MOS transistor of the depletion mode, of which the gate is connected to the output terminal of the inverter, the first end is connected to a supply node of the first or second power source voltage, and the second end is connected to a power voltage supply node of the inverter circuit.

The semiconductor memory integrated circuit thus arranged uses the decode output buffer instead of the charge pump. The decode output buffer is of an inverter circuit arrangement and is provided between the decoder and the memory matrix. The normal read voltage or the normal write high voltage is selectively applied as a power source to the decode output buffer. The power source voltage is applied to the non-selected decode line, and inverted by an inverter circuit contained in the decode output buffer. The inverted signal is inputted to the gate of the MOS transistor of the depletion mode, thereby to charge the power source voltage supply node by the threshold voltage of that MOS transistor. A reference voltage is applied to the selected decode line. The inverter circuit in the decode output buffer is inverted by the charge voltage at the power source supply node, through the MOS transistor of the depletion mode. The output signal of the inverter circuit is fed back to the gate of the MOS transistor, and is boosted up to a desired voltage. With this, no stationary current flows through the nonselected decode line.

BRIEF DESCRIPTION OF THE DRAWINGS

FIG. 3 is a circuit diagram of a decode output buffer in a semiconductor memory integrated circuit according to an embodiment of the present invention;

FIG. 4 is a circuit diagram of a decode output buffer in a semiconductor memory integrated circuit according to another embodiment of the present invention;

FIG. 5 is a circuit diagram of a decode output buffer in a semiconductor memory integrated circuit according to yet another embodiment of the present invention;

FIG. 6 is a circuit diagram of a decode output buffer in a semiconductor memory integrated circuit according to a further embodiment of the present invention;

FIG. 8 is a circuit diagram of a high voltage generator used in the semiconductor memory of FIG. 7.

DETAILED DESCRIPTION OF THE PREFERRED EMBODIMENTS

Figure 1:
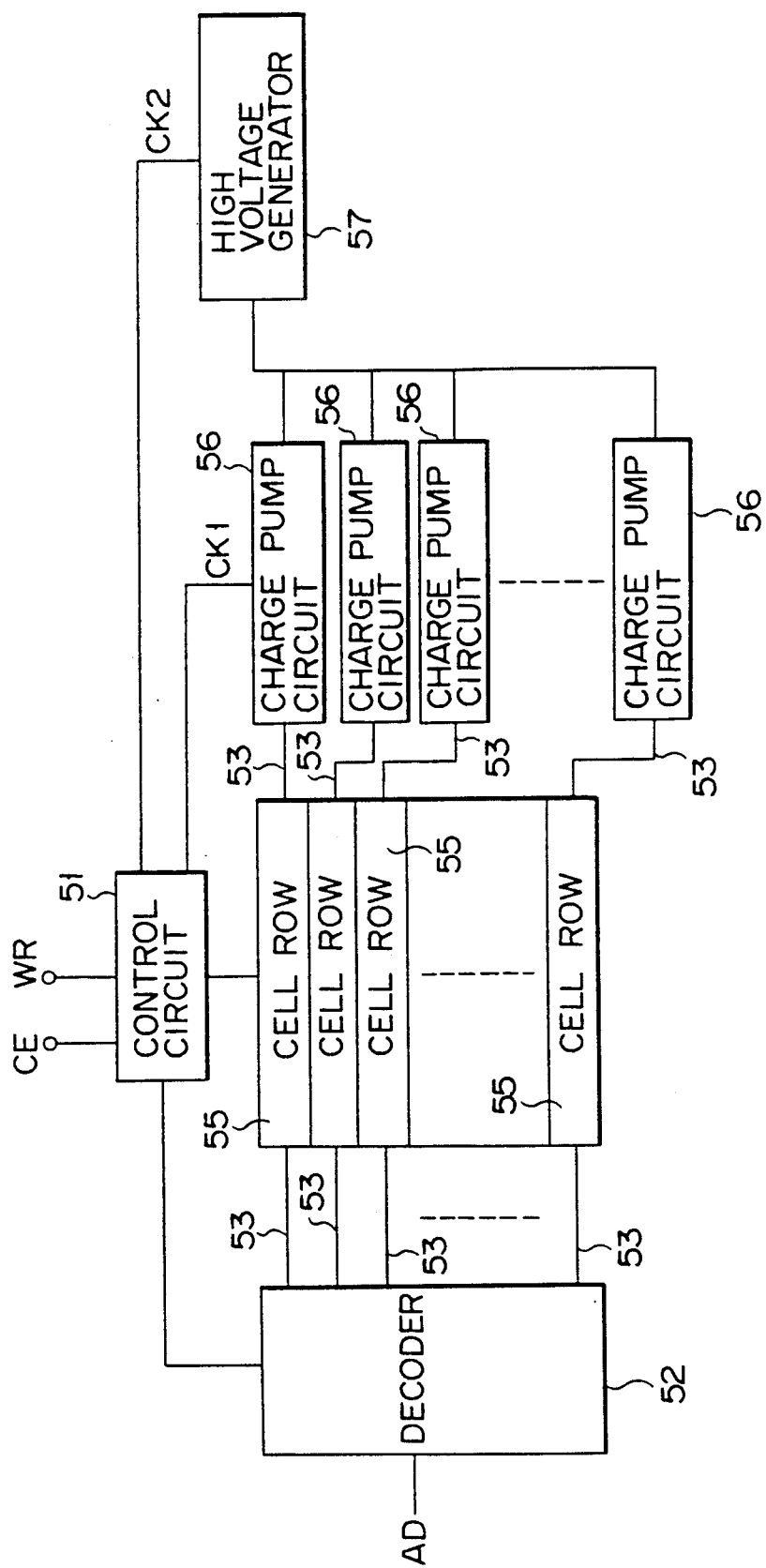
FIG. 1 shows a block diagram of a conventional semiconductor memory integrated circuit.
Figure 2:
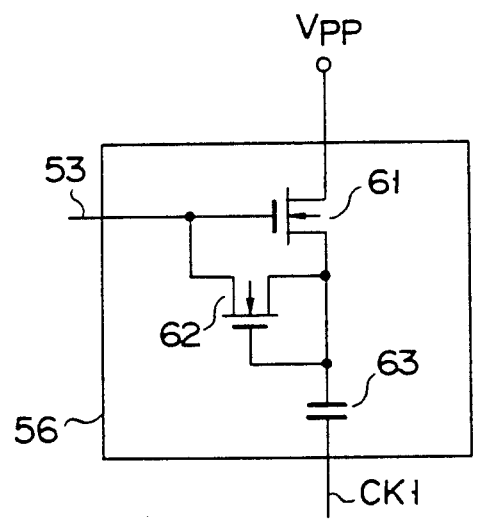
FIG. 2 is a circuit diagram of a charge pump circuit used in the semiconductor memory of FIG. 1.
Figure 7:
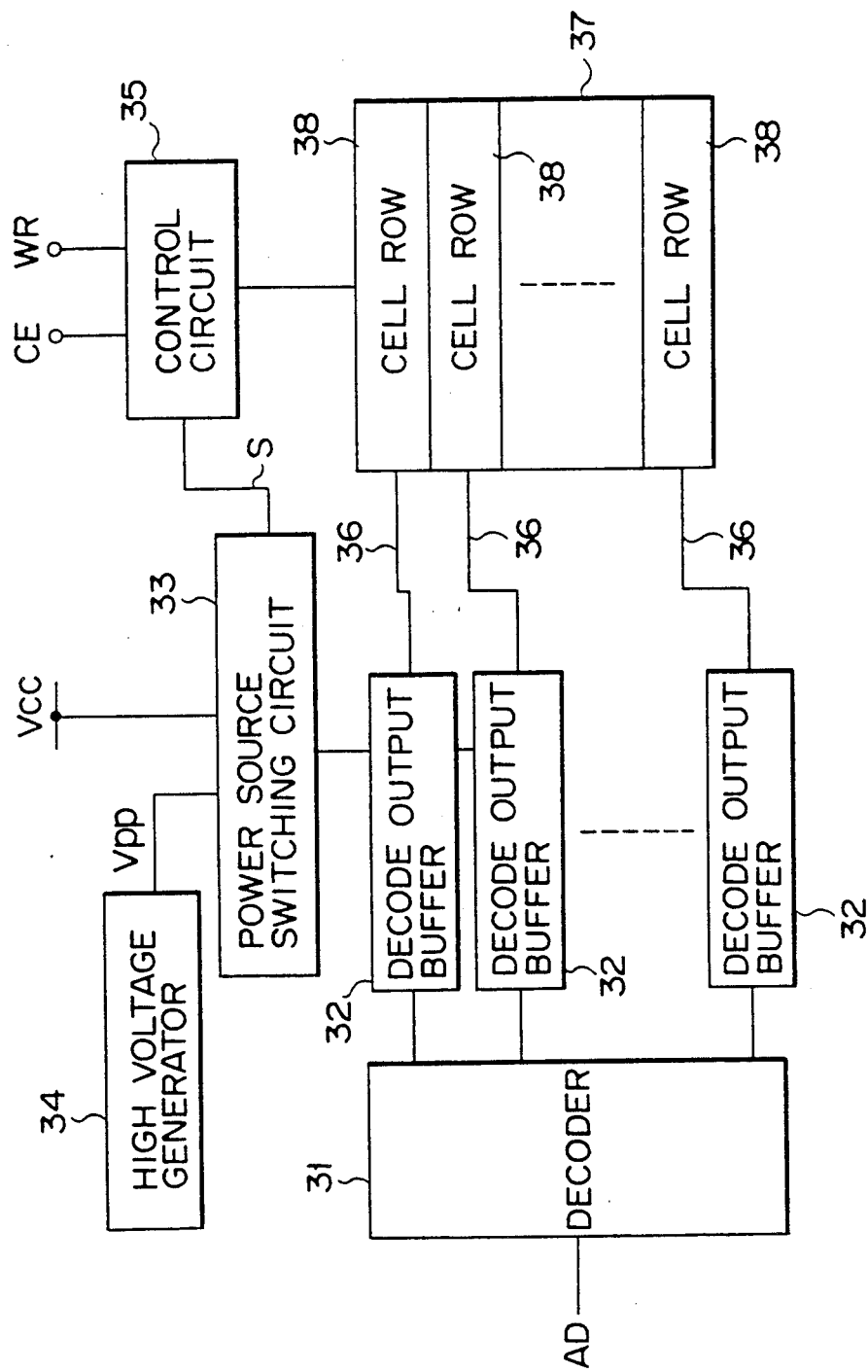
FIG. 7 is a block diagram of a semiconductor memory integrated circuit using any of the decode output buffers of FIGS. 3 to 6.

FIGS. 3 to 6, respectively, show first to fourth embodiments of semiconductor memory integrated circuits according to the present invention. These are specific circuit diagrams of decode output buffers, which are available for an EEPROM (electrically erasable and programmable ROM) structured as shown in FIG. 7. The EEPROM is placed in an operation mode by a chip enable signal CE that is applied to a controller 35. During this operation mode, data is written into the memory cell by a write signal WR supplied to the controller 35. To write data, an input address signal AD is decoded by a decoder 31 and is applied to a decode output buffer or buffers 32. The decode output buffer 32 is coupled with a power source switching circuit or selector 33, which is coupled with a high voltage generator 34 for generating a high voltage Vpp and a normal power source voltage Vcc, and further coupled with a control circuit or controller 35. Under control of the controller 35, the selector 33 selects one of the voltages Vpp and Vcc, and supplies it as a power source voltage to the output buffer or buffers 32. The output voltage of the output buffer 32 is applied to a corresponding cell row 38 in the memory cell matrix 37, by way of the decode line 36 connected to that cell row.

The high voltage generator 34, as shown in FIG. 8, is constructed with a plurality of n-channel MOS transistors 41 whose respective gates and drains are connected in series. The drain of the MOS transistor at the first stage of the transistor series serves as a power source terminal receiving the power source voltage Vcc. The gates of the transistors of the even numbered stages of the transistor series are respectively coupled for reception with a clock signal CK through capacitors 45. The gates of the transistors of the odd numbered stages of the transistor series, which starts with the third stage of the transistor series, are coupled for reception with a complementary clock signal $\overline{CK}$, through an inverter and transistors 45. By the clock signals CK and $\overline{CK}$, the capacitors 45 are repeatedly charged and discharged. In other words, in synchronism with the clock signals CK and $\overline{CK}$, the charges in the capacitor 45 in one of those stages of transistors are additively and progressively transferred through its stage of transistor 42 to the next stage of the transistor 42. Finally, the charges thus increased are output from the source of the final stage of transistor 41, viz., the output terminal, in the form of the high voltage Vpp. The clock signal CK is constantly generated at fixed periods by a clock pulse generator (not shown), during the operation mode in which the enable signal CE of the EEPROM is being generated.

FIG. 3 shows a circuit arrangement of a decode output buffer, which is available for the semiconductor memory of FIG. 7. As shown, the output buffer is made up of an inverter 13 and an n-channel MOS transistor 14 of the depletion mode. The inverter 13 comprises p- and n-channel MOS transistors 11 and 12. These transistors 11 and 12 are interconnected at the gates. An input terminal In is coupled with the interconnected gates of the transistors. The transistors 11 and 12 are also interconnected at the drains. An output terminal Out is coupled with the interconnected drains of the transistors. The transistor 14 is coupled at the gate with the output terminal Out, at the source with the source of the transistor 11 in the inverter 13, and at the drain with a power source terminal 15. The terminal 15 selectively receives the voltage Vcc or Vpp through the power source selector 33 (see FIG. 7). The source of the transistor 12 is connected to a reference voltage Vss.

The operation of the decode output buffer thus arranged will be described with reference to FIGS. 3 and 7. It is assumed that the selector 33 selects the power source voltage Vcc of 5V, for example, and couples it with the power source terminal 15 of the decode output buffer 32.

When the output signal of the decoder 31 is in a non-select level, the voltage of the output signal is the voltage Vcc, i.e., 5V. In this case, the 5V appears at the input terminal In, and turns on the transistor 12, and the output buffer produces an output signal of 0V at the output terminal Out. The 0V signal is applied to the gate of the transistor 14, and is output from the output terminal Out. The voltage is applied through the non-selected decode line 36 led from the output terminal Out to the cell row 38 coupled with the decode line 36. Since the transistor 14 is of the depletion type and receives at the drain the 5V voltage through the terminal 15, current flows from the terminal 15 into the transistor 14 and charges a node A through the transistor 14. When the charge to the node A progresses and reaches a voltage equal to an absolute value of the threshold voltage of the transistor 14, the transistor 14 is cut off. Since the node A is at that voltage, the transistor 11 coupled at the gate with the 5V voltage is in an off state. Thus, when the output signal of the decoder 31 is in a non-select level, the output terminal Out is kept at 0V, and hence the cell row 38 coupled with the non-selected decode line 36 is also kept at 0V.

When the output signal of the decoder 31 is in a select level, the potential of the output signal is 0V, and hence 0V is applied to the input terminal In of the output buffer. In turn, the transistor 12 is turned off. At this time, the node A has been charged to the voltage equal to the absolute value of the threshold voltage of the transistor 14, and hence the transistor 11 is turned on. Accordingly, that voltage appears at the output terminal Out through the transistor 11. The voltage is fed back to the gate of the transistor 14, so that the voltage at the node A is increased by the gate voltage of the transistor 14. Finally, the voltage 5V applied to the power source terminal 15 is output from the output terminal 15. Thus, when the output signal of the decoder 31 is in the select level, the output terminal Out is kept at 5V, and hence the 5V signal is applied to the cell row connected to the selected decode line 36 (see FIG. 7).

Let us now consider a case in which the high voltage Vpp, e.g., 20V, is applied to the power source terminal 15. In this case, if the decode output signal is in the non-select level of 5V, the transistor 12 is turned on, and the voltage of 0V appears at the output terminal Out. The 0V output signal is applied to the gate of the transistor 14. Then, the transistor 14 is turned on and allows a current to flow from the terminal 15 to the node A. This node is charged by the current, up to the voltage equal to the absolute value of the threshold voltage of the transistor 14. Then, the transistor 14 is turned off. At this time, the transistor 11, which has been at 5V at the gate, is also turned off, because the node A is at that voltage. Accordingly, the 0V is applied to the cell row 38 connected to the non-selected decode line 36. When the decode output signal is at 0V, the transistor 12 is turned off. Since the node A has been charged at the voltage equal to the absolute value of the threshold voltage of the transistor 14, the transistor 11 is turned on. As a result, the signal of that voltage appears at the output terminal Out. This voltage is fed back to the gate of the transistor 14, and the voltage at the node A is further increased by the gate voltage of the transistor 14. Finally, the voltage of 20V applied to the terminal 15 is output from the output terminal Out. Accordingly, the 20V voltage is applied to the cell row 38 connected the selected decode line 36.

In the semiconductor memory integrated circuit (IC) thus arranged, the selected decode line is fixed at 0 V, and the non-selected decode line, at 5V. No increase of the decode line voltage will occur, whereas in the conventional memory IC using the pumping circuits, the decode line voltage is increased by the pumping action. Accordingly, irrespective of the power source voltages Vcc and Vpp applied to the power source terminal 15, the current flow in the non-selected decode line is caused by only the current to charge the node A that is caused by the voltage applied to the terminal 15, and by the current to discharge the output terminal Out through the transistor 12. The current flow in the selected decode line is caused by only the current to charge the output terminal Out through the transistors 14 and 11. Thus, no current flows from the terminal 15 to the non-selected code line, ensuring the supply of a stable voltage to a desired cell row.

FIG. 4 shows another arrangement of the decode output buffer according to the present invention. In the output buffer of FIG. 4, when the transistor 11 which receives at the gate the voltage of 0V from the input terminal In, is turned on, the voltage equal to the threshold voltage of the transistor 14 that has been set at the node A, starts to charge the output terminal Out. By feeding back this voltage, it is charged by the voltage applied to the terminal 15. Accordingly, relatively much time is consumed until the output terminal Out has been satisfactorily charged. This results in a delay of the operation of the memory IC. To minimize the operation delay, an n-channel MOS transistor 16 of the depletion mode is provided between the power source voltage Vcc of 5V and the node A. A control signal of the controller 35 is applied to the gate of the transistor 16 so that it is turned on when 5V is applied to the input terminal In. With the application of the 5V voltage, the node A is charged up to 5V. In the circuit arrangement of the output buffer of FIG. 4, the initial voltage at the start of the charging is high, 5V. Accordingly, the output buffer can more quickly charge the output terminal Out than the output buffer of FIG. 3.

FIG. 5 shows a yet another arrangement of the decode output buffer according to the present invention. As shown, the input terminal In is connected to the interconnected gates of p- and n-channel MOS transistors 21 and 22, which make up an inverter 23. The source of the transistor 21 in the inverter 23 is coupled with the power source voltage Vcc. The source of the transistor 22 is connected to the reference voltage Vss. The interconnected drains of the transistors 21 and 22 in the inverter 23 are connected to the output terminal Out, through the source - drain path of an n-channel MOS transistor 24 of the depletion type whose gate is coupled for reception with a control signal S which is derived from the controller 33 (FIG. 7). The interconnected gates of the inverter 23 are coupled with the gate of a p-channel MOS transistor 25 whose drain is connected to the output terminal Out. The terminal Out is also connected to the gate of a p-channel MOS transistor 26. The transistor 26 is connected at the source to the source of the transistor 25, and at the drain to the power source terminal 27. A power source terminal 27 is selectively coupled for reception with the voltage Vcc or Vpp, through the power source selector 33 (FIG. 7).

In operation, the power source voltage Vcc of 2V, for example, is applied as the power source voltage Vcc to the inverter 23. The control signal S is in logic "1" level when the normal voltage Vcc of 2V is applied to the terminal 27, and is in logic "0" level when the write voltage Vpp (20V) is applied to the terminal.

It is assumed now that the selector 33 (FIG. 7) selects the voltage Vcc of 2V and applies it to the power source terminal 27 of the buffer 32. When the output signal of the decoder 31 is in the non-select level, the decode output signal is at 2V. At this time, the transistor 21 is turned off, while the transistor 22 is turned on. Accordingly, the output signal of the inverter 23 is at 0V. Since the transistor 24 is in an on state, the output terminal Out is also at 0V. As a result, the transistor 26 whose gate is at 0V is turned on. If the threshold voltage of the transistor 26 is below 2V, the transistor 26 is cut off when the node A between the transistors 25 and 26 is charged up to the absolute value of the threshold voltage of the transistor 26. As a result, when the decoder output signal is in the non-select level, the charge to discharge the output terminal Out up to 0V flows through the transistors 24 and 22 toward the power source Vss. Therefore, there is no current flowing from the terminal 27 through the transistors 26 and 25 to the non-selected decode line. When the output signal of the decoder 31 is in the select level, the transistor 22 is turned off, and the transistor 21 is turned on. Accordingly, the output signal of the inverter 23 is at 2V. Since the transistor 24 has also been in an on state, the output terminal Out is also at 2V. The 2V is applied to the gate of the transistor 26 to turn on the transistor. With the presence of 0V at the input terminal In, the transistor 25 is turned on, so that the 2V applied to the power source terminal 27 appears at the output terminal Out. At this time, the transistor 22 is in an off state, no current flows through the transistor 21 to the power source Vss. Only the current to charge the output terminal Out flows through the transistor 22.

Considering the case in which the high voltage Vcc, e.g., 20V, is applied to the power source terminal 27. When the output signal of the decoder 31 is in the non-select level, the 2V is applied to the input terminal In. As a result, the transistor 21 is turned off, and the transistor 22 is turned on. Accordingly, the output signal of the inverter 23 is at 0V. At this time, the transistor 24 whose gate receives the control signal of logic "0" level (0V) has been in an on state. Therefore, the output terminal Out is also at 0V. The transistor 26 whose gate receives the 0V is turned on. At this time, the transistor 25 which has received the 0V from the input terminal In, has been in an off state. After the node A is charged by an amount of the threshold voltage of the transistor 26, the transistor 26 is cut off. The result is that, as described, when the decoder output is in the non-select level, only the current to discharge the output terminal Out up to 0V flows through the transistors 24 and 22 to the reference voltage source Vss. No current flows from the power source terminal 27 to the non-selected decode line through the transistors 26 and 25. When the decoder output signal is in the select level, 0V is applied to the input terminal In. Accordingly, the transistor 22 is turned off, and the transistor 21 is turned on. As a result, the output of the inverter 23 is at 2V. The transistor 24 which is coupled at the gate with the control signal S of logic "0" level (0V) is cut off when the output terminal Out is charged up to the absolute value of the threshold voltage of the transistor 24. The transistor 26 whose gate is coupled with the voltage of the output terminal Out, is turned on, and the sum of its gate voltage and that absolute value voltage is output to the node A. At this time, the transistor 25 that is coupled for reception with the 2V from the input terminal In, has been in an on state. Accordingly, the voltage at the node A is output to the output terminal Out, and is fed back through the gate of the transistor 26. Finally, the high voltage Vpp at the power source terminal 27 is output. In this case, the transistors 22 and 24 are in a cut-off state, and hence the high voltage Vpp at the power source terminal 27 causes no current.

FIG. 6 shows a still further arrangement of the decode output buffer. In the output buffer, 0V is applied to the input terminal In, and the transistor 25 is turned on. The voltage equal to the threshold voltage of the transistor 26, which has been at the node A, starts to charge the output terminal Out. With the feed-back of the charged voltage, it is charged by the voltage applied to the power source terminal 27. The threshold voltage of the transistor 26 is very low. Because of this, much time is taken to satisfactorily charge the output terminal Out. This results in an operation delay of the output buffer. To minimize this, a p-channel MOS transistor 28 and an n-channel MOS transistor 29 of the LE (low emitter) depletion mode, which are connected in series, are inserted between the voltage source Vcc and the node A. The output signal of the inverter 23 is applied to the gate of the transistor 28, and the input signal at the input terminal In is applied to the gate of the transistor 29. The transistor 29 is turned on at the non-select time to charge the node A at 2V. With this, the initial voltage is high, 5V, at the start of charging, and therefore, the output buffer of FIG. 6 can more quickly charge the output terminal Out up to a satisfactorily high voltage than the output buffer of FIG. 5.

As seen from the foregoing description, when any of the decode output buffers of FIGS. 3 to 6 is assembled into the semiconductor memory integrated circuit, the memory IC is operable to write and read data to and from the memory cells, with extremely less amount of current loss. In the output buffers as mentioned above, the CMOS inverter are used for the decode output buffers 32. It is evident that it may be replaced by any type of circuit if it is able to invert the input signal. Other voltages than 5V and 2V may be appropriately selected, if required.

As described above, the present invention has successfully provided a semiconductor memory integrated circuit, which is free from the deleterious current flowing to the non-selected decode line, and is operable at a low voltage and hence with low power dissipation.

What is claimed is:

1. A semiconductor memory integrated circuit comprising:
   a decoder;
   a memory matrix;
   a selector for receiving a first power source voltage and a second power source voltage, and for selecting said first or second power source voltage; and
   a decode output buffer for receiving said first or second power source voltage from said selector, said decode output buffer being provided between said decoder and said memory matrix, and including an inverter circuit, having a first power source terminal connected to a reference power source voltage and a second power source terminal, for inverting an output signal of said decoder, a first MOS transistor of a depletion mode, the gate of which is connected to the output terminal of said inverter circuit, the first end of which is connected to said first or second power source voltage selected by said selector, and the second end of which is connected to said second power source terminal of said inverter circuit, and a second MOS transistor of the depletion mode, the first end of which is connected to said first power source voltage, and the second end of which is connected to said second power source terminal of said inverter circuit, the conduction of said second MOS transistor being controlled in accordance with the output signal of said decoder.

2. A semiconductor memory integrated circuit comprising:
   a decoder;
   a memory matrix;
   a selector for receiving a first power source voltage and a second power source voltage, and for selecting said first or second power source voltage; and
   a decode output buffer for receiving said first or second power source voltage from said selector, said decode output buffer being provided between said decoder and said memory matrix, and including an inverter circuit, having a first power source terminal connected to a reference power source voltage and a second power source terminal, for inverting an output signal of said decoder, a first MOS transistor of a depletion mode, the first end of which is connected to the output terminal of said inverter circuit and the gate of which is supplied with a control signal, a second MOS transistor of the depletion mode, the first end of which is connected to said first or second power source voltage selected by said selector, and the gate of which is connected to the second end of said first transistor, and a third MOS transistor, the first end of which is connected to the second end of said second MOS transistor, the second end of which is connected to the second end of said first MOS transistor, and the gate of which is supplied with the output signal of said decoder.

3. A semiconductor memory integrated circuit comprising:
   a decoder;
   a memory matrix;
   a selector for receiving a first power source voltage and a second power source voltage, and for selecting said first or second power source voltage; and
   a decode output buffer for receiving said first or second power source voltage from said selector, said decode output buffer being provided between said decoder and said memory matrix, and including an inverter circuit, having a first power source terminal connected to a reference power source voltage and a second power source terminal, for inverting an output signal of said decoder, a first MOS transistor of a depletion mode, the first end of which is connected to the output terminal of said inverter circuit, and the gate of which is supplied with a control signal, a second MOS transistor of the depletion mode, the first end of which is connected to said first or second power source voltage selected by said selector, and the gate of which is connected to the second end of said first transistor, a third MOS transistor, the first end of which is connected to the second end of said second MOS transistor, the second end of which is connected to the second end of said first MOS transistor, and the gate of which is supplied with the output signal of said decoder, a fourth MOS transistor, the first end of which is connected to said first power source voltage, and the gate of which is supplied with the output signal of said inverter circuit, and a fifth MOS transistor, the first end of which is connected to the second end of said fourth MOS transistor, the second end of which is connected to the first end of said third MOS transistor, and the gate of which is supplied with the output signal of said decoder.

* * * * *